(12) United States Patent
Uhl et al.

(10) Patent No.: US 6,875,962 B2
(45) Date of Patent: Apr. 5, 2005

(54) ELECTRIC HEATING SYSTEM FOR A MOTOR VEHICLE

(76) Inventors: Günther Uhl, Hauptstrasse 88, D-74921 Helmstadt-Bargen (DE); Steffen Geiger, Dresdener Strasse 23, D-71679 Asperg (DE); Thomas Alban, Heilbronner Strasse 31, D-74252 Massenbachhausen (DE); Thomas Giffels, Burgenlandstrasse 80b, D-70469 Stuttgart (DE); Dirk Wenske, Eugen-Bolz-Strasse 7, D-71636 Ludwigsburg (DE); Andreas Hamburger, Kurt-Schumacher-Strasse 19, D-76726 Germersheim (DE); Mike Riether, Litzelhorststrasse 19, D-76863 Herxheim (DE)

(*) Notice: Subject to any disclaimer, the term of this patent is extended or adjusted under 35 U.S.C. 154(b) by 0 days.

(21) Appl. No.: 10/466,750

(22) PCT Filed: Jan. 17, 2002

(86) PCT No.: PCT/EP02/00408
§ 371 (c)(1),
(2), (4) Date: Oct. 14, 2003

(87) PCT Pub. No.: WO02/057100
PCT Pub. Date: Jul. 25, 2002

(65) Prior Publication Data
US 2004/0112884 A1 Jun. 17, 2004

(30) Foreign Application Priority Data
Jan. 17, 2001 (DE) .......................................... 101 02 671

(51) Int. Cl.$^7$ ............................................... H05B 3/06
(52) U.S. Cl. ....................... 219/530; 219/540; 219/202; 219/209
(58) Field of Search .................................. 219/530, 540, 219/202, 203; 392/347

(56) References Cited

U.S. PATENT DOCUMENTS

| | | | | |
|---|---|---|---|---|
| 4,314,270 A | * | 2/1982 | Iwatani ........................ | 257/708 |
| 4,419,564 A | * | 12/1983 | Marcoux ...................... | 219/206 |
| 5,606,639 A | * | 2/1997 | Lehoe et al. ................. | 392/353 |
| 5,990,459 A | * | 11/1999 | Feustel et al. .............. | 219/486 |
| 6,060,699 A | * | 5/2000 | Sakurai et al. .............. | 219/541 |
| 6,392,207 B2 | * | 5/2002 | Beetz et al. ................. | 219/530 |
| 2003/0180033 A1 | * | 9/2003 | Alban et al. ................. | 392/347 |

FOREIGN PATENT DOCUMENTS

| | | |
|---|---|---|
| DE | 19848169 | 5/1999 |
| DE | 19902050 | 9/1999 |
| DE | 10015905 | 10/2001 |
| EP | 0682467 | 11/1995 |
| EP | 1164816 | 12/2001 |

* cited by examiner

Primary Examiner—Robin O. Evans
Assistant Examiner—Vinod Patel (57) ABSTRACT

An electric heating system for motor vehicles including one or several electric heating elements; a control circuit provided for controlling the power dissipated by the heating elements; the control circuit including one or several power semiconductors arranged on a circuit board; the circuit board is by means of a solid matter connection connected by the side facing away from the power semiconductors to a metal plate intended to be mass potential; the metal plate being electrically insulated from conductor paths located on the underside of the circuit board and intended to carry a voltage in relation to the ground potential; the control circuit being arranged in a housing. One or several heat sinks are provided outside the housing. The metal plate is connected with the heat sinks arranged outside the housing by thermally conductive connectors.

43 Claims, 5 Drawing Sheets

ELECTRIC HEATING SYSTEM FOR A MOTOR VEHICLE

BACKGROUND OF THE INVENTION

1. Field of the Invention

The present invention relates to an electric heating system for a motor vehicle.

2. Description of the Related Art

A heating system of that kind has been known from DE 199 02 050 A1 as an auxiliary heating system for a motor vehicle that is driven by a combustion engine. As a rule, motor vehicle heating systems utilize the waste heat produced by the combustion engine. However, the continuous progress made in increasing the efficiency of combustion engines has resulted in reducing the amount of waste heat available for the heating system. This is true especially for those direct-injection diesel engines which are designed especially for fuel economy. Due to their small yield of waste heat, these engines do not, especially in winter times, warm up the vehicle as quickly as would be desirable for defrosting the windscreen, to prevent fogging of the windscreen and to heat up the passenger compartment to a comfortable temperature. It is, therefore, known from DE 199 02 050 A1 to provide an electric auxiliary heating system with a power of, typically, between 250 Watts and 2,000 Watts. The know auxiliary heating system uses for this purpose a plurality of electric heating rods which are combined with the water-carrying main heating system of the vehicle to form a joint heat exchanger that transmits its heat to an air flow directed into the passenger compartment. However, heat exchangers and electric auxiliary heating systems are frequently implemented also as two separate units.

The electric heating rods are supplied with current of an intensity of, typically, 30 A and their output is controlled by a control circuit which controls the power of the auxiliary heating system with the aid of one or more power semiconductors. In their operative condition, the power semiconductors have a resistance which cannot be ignored, and accordingly produce heat, due to energy losses, in the order of 10 Watts each, for example. The heat loss encountered in the power semiconductors must be eliminated if damage to the control circuit and to any plastic components in its neighborhood is to be prevented. The control circuit, together with its power semiconductors and heat sinks, is arranged for this purpose on a circuit board, which is combined with the heat exchanger to a single unit which is positioned in the air current that flows through the heat exchanger. It is a disadvantage of that arrangement that being positioned in the air current, the control circuit is not protected from environmental influences, and electric safety is not guaranteed, and this the more as the air current may exhibit a high degree of humidity that may deposit on the control circuit temporarily.

BRIEF SUMMARY OF THE INVENTION

Now, it is the object of the present invention to show a way how the protection of the control circuit and the electric safety of an electric heating system for a motor vehicle can be improved, while simultaneously carrying off the heat loss from the control circuit, without the structure of the auxiliary heating system being considerably complicated.

This object, the aims of which partly exclude each other, is achieved by an electric heating system having the characteristics defined in Claim 1. Advantageous further developments of the invention are the subject matter of the sub-claims.

It is a fundamental problem connected with the object to be achieved that the heat-dissipating mounting surfaces of the power semiconductors, which guide and connect the current for the heating elements, are connected to positive potential whereas the heat sinks should be connected to ground potential for safety reasons. The power semiconductors used are normally MOSFETs which, preferably, operate according to a pulse-duration modulation method. The heat loss from the power semiconductors must, therefore, be dissipated under contradictory marginal conditions, namely the condition that sufficient thermal coupling and electric insulation should be achieved at the same time. This problem is further aggravated by the fact that as a rule the heat-dissipating surface of the power semiconductors faces the circuit board on which it is fixed by soldering.

One might think of using special circuit boards where an insulating layer is applied on a metal plate, and a copper coating is applied on top, which copper layer can then be structured by an etching process. Circuit boards of that kind are, however, very expensive and this above all when a double-layer circuit board must be produced on the metal plate.

The invention now proposes to transfer the heat losses encountered in the power semiconductors through the circuit board to its bottom surface and from there into a metal plate, which is connected with the bottom surface of the circuit board by a solid-matter connection. The metal plate should be connected to ground potential, being thereby insulated from any conductor paths that may be present on the bottom surface of the circuit board and that may carry a potential. The insulating effect may be achieved by the material that provides the solid-matter connection between the metal plate and the circuit board. In the presence of the required electric insulation, the solid-matter connection guarantees optimum transmission of the heat loss from the circuit board to the metal plate, which has a comparatively high thermal capacity, thus forming a heat sink—favorable for dissipation of the heat—into which the heat loss can flow along the shortest possible path from the equipment side of the circuit board and through the latter. The heat is then carried off from that heat sink and transmitted via one or more heat-dissipating connectors to one or more dissipators that may be arranged at a certain distance from the control circuit, so that they can be cooled by an air current that does not reach the control circuit as such. Instead, the control circuit is provided in protected arrangement in a housing which also contains the metal plate from which the one or more heat-dissipating connectors are brought out. Thus, heat-dissipation is a two-step process by which the heat loss of the power semiconductors is initially collected by the metal plate and is then transmitted through the latter, via heat-dissipating connectors, to external dissipators.

The invention provides substantial advantages:

Heating-up of the control circuit is effectively limited.

At the same time, the control circuit can be accommodated in protected arrangement in a housing that need not be entered by the cooling air current.

The use of a metal plate as a heat sink, which is connected with the circuit board by a solid-matter connection, provides a favorable solution under both production and cost aspects.

As will be shown hereafter, the use of a metal plate, which is connected with the circuit board by a solid-matter connection, opens up possibilities for a cost-saving structure and cost-saving installation of the electric heating.

In order to be able to easily absorb, spread and dissipate the heat transmitted to it, the metal plate preferably consists of a highly heat-conducting metal, especially aluminum or copper, or of alloys of such metals; a metal plate having a thickness of approximately 1 mm is well suited for that purpose.

Preferably, the solid-mater connection between the metal plate and the circuit board is implemented by glueing the two materials one to the other. Electrically insulating glues with a relatively high thermal conductivity are known as such. The glue layer has a thermal conductivity of, preferably, at least 0.6 W/(m×K), more preferably at least 0.9 W/(m×K). A glue based on a cross-linked two-component silicon elastomer, which combines in itself the high thermal conductivity of more than 0.9 W/(m×K) with long-time elasticity that guarantees intactness of the connection even under the high vibration stresses found in a motor vehicle is especially well suited. If necessary, the electric insulating effect of the bond may be supplemented by a thin layer of synthetic resin varnish applied upon that side of the plate that faces the circuit board, or by a thin oxide layer which may be anodically reinforced, especially in the case of aluminum.

Given the fact that the layer forming the solid-mater connection between the metal plate and the circuit board is to transmit the heat from the circuit board to the metal plate, care should be taken to make the layer as thin as possible and free from pores. Preferably, the thickness of that layer is selected to be maximally 0.2 mm, more preferably maximally 0.15 mm. It should be considered in this connection that because of the conductor paths present on the underside of the circuit board, the thickness of that layer may not be smaller than the height of the conductor paths which may have a value of up to 140 $\mu$m, depending on the current intensity to be conducted.

Preferably, rigid spacers are provided between the metal plate and the circuit board, which guarantee a uniform small distance between the metal plate and the circuit board and which allow the thickness of the electric insulating layer to be minimized and the heat transmission to be maximized. The spacers may consist of thin disks bonded onto the metal sheet and/or the circuit board. However, according to a more favorable solution, the spacers consist of bumps provided on the metal plate in areas opposite to the underside of the circuit board where no conductor paths are present. Such spacers can be formed in the simplest of all cases by proper embossing of the metal sheet. According to a preferred further development of the invention, there is however also the possibility to provide that the one or the other bump on the metal plate establishes an electrically conductive connection to a conductor path on the circuit board, which is connected to ground potential, so as to provide defined and safe voltage conditions.

Preferably, the size of the metal plate is selected to be approximately equal to the size of the circuit board and to have approximately the same contour. One thus obtains a sandwich-like assembly which can be easily installed in the housing of the control circuit.

In the case of a power conductor whose heat-dissipating surface is an electric contact surface that faces the circuit board and is connected with it by soldering (in the case of a MOSFET such contact surface is regularly connected to positive potential) it is favorable for purposes of the invention if those areas of the circuit board, in which the power semiconductors are arranged, exhibit a high density of electric current paths that lead from the equipment side of the circuit board and through the latter to its underside, as this considerably increases the thermal conductivity through the circuit board in the area below the power semiconductors; the heat loss then can take the shortest way through the circuit board, along the highly conductive paths, and then only has to pass the thin adhesive layer to reach the metal plate. The current paths can be produced by drilling several holes through the circuit board in the stated areas and by metallizing and finally filling the bores with metal, for example by copper-plating the bores galvanically, or by tin-plating bores that have been galvanically metallized before.

Preferably, each of the areas in which current paths crossing the circuit board are arranged is approximately as large as the basis of the respective power semiconductor. Further, it is preferred to combine the current paths provided for one power semiconductor by having the current paths end, on both the equipment side and the bottom surface of the circuit board, in metal surfaces of a size that is approximately equal to the basis of the respective power semiconductor.

The heat loss transmitted to the metal plate must of course be dissipated by the latter, for which purpose it is connected to one or more heat sinks via one or more heat-conducting connectors. The heat-conducting connectors may be connected to the metal plate on the one hand and to the heat sinks on the other hand by soldering or welding. Preferably, however, they are connected by a plug-in connection which facilitates there assembly and disassembly for maintenance purposes and reduces their production costs.

Generally, the respective connector could be flexible, for example a flexible cord. The heat sinks and the control circuit would then have to be mounted on carrying structures separately. It is therefore preferred to give the connectors a rigid configuration, for example that of a rod or hollow rod. The control circuit and its external heat sinks, coupled with it via connectors, then form an assembly, which though being assembled in a detachable way can be mounted in the vehicle with the aid of uniform, common mounting means.

For realizing the connection between the metal plate and the rigid connectors, tongues arranged in pairs one opposite the other may be cut out from the metal plate and be bent off from the plane of the metal plate. If the distance between the tongues is smaller than the thickness of the rigid connector, then the latter can be introduced between such a pair of tongues in clamping relationship, in which case withdrawal of the connectors from between the tongues is restrained by proper selection of the bending direction of the tongues.

The heat sinks preferably consist of metal sheets. Preferably, a plurality of heat sinks and a plurality of, conveniently, parallel connectors are provided, the heat sinks being pushed onto the connectors in such a way that the heat sinks and the connectors mutually connect and stabilize each other in their respective positions, whereby an easily manageable, sufficiently rigid structure is obtained. The heat sinks (metal sheets) may be connected with the connectors be soldering or welding; but as they do not have to take up high forces, it will also be sufficient to fix the heat sinks on the connectors in a force-locking way, for example by clamping.

The length of the conductors is selected to ensure that with respect to the envisaged place of installation of the control circuit the heat sinks will come to lie in a flow path intended to cool them, preferably in that flow path of the air in which the heat-dissipating means of the electric heating of the motor vehicle are likewise positioned. Preferably, the heat sinks come to lie in the neighborhood of the heat-dissipating means of the electric heating system, especially between such means and the housing of the electronic control unit, though at a certain distance from that housing.

An especially low-cost and compact structure of the heating system is achieved by the fact that the heating elements are contained in heating rods which simultaneously serve as conductors between the metal plate and the heat sinks so that not only the heat-dissipating means of the electric heating, but also the heat sinks are mounted on the heating rods. There is, however, also the possibility to separate the heating rods of the electric heating system and the connectors between the metal plate of the control circuit and its heat sinks mechanically. However, if the heating rods are simultaneously used as carriers for the heat sinks, then this opens up the possibility to combine the heating rods with their heat-dissipating means, the heat sinks and the housing with the control circuit to form a compact unit, in which case the control circuit with its housing on the one hand and the heating rods with their heat-dissipating means and their heat sinks on the other hand can be connected one with the other in a sufficiently stiff and firm way, both electrically and mechanically, which connection is considerably facilitated by the use of the metal plate on the underside of the circuit board which forms a mechanically stable basis for mounting the control circuit on the heating rods, which later simultaneously act as connectors between the metal plate and the heat sinks of the control circuit. The control circuit can be mounted on the heating rod especially by introducing the heating rods between pairs of cut-out and bent-up reeds which act on the heating rods in a clamping and guiding way. A particular mechanical load-carrying capacity is no longer needed for effecting the electric connection between the heating elements and the control circuit on the circuit board, that load-carrying capacity having been already achieved by the plug-in connection realized with the aid of the metal plate.

Both the electric connectors formed on the control circuit and the mechanical connectors for the heating rods formed on the metal plate are preferably designed to have their plug-in direction coincide with the longitudinal direction of the heating rods. This facilitates the operations of connecting and separating the heating rods and their control circuit. While the mechanical connector should be formed on the side of the metal plate facing away from the circuit board, the electric connector for the heating rods should, preferably, be arranged on the side of the circuit board facing away from the metal plate, and should be accessible for the electric supply line to the respective heating rod through holes in the metal plate and the circuit board positioned one above the other.

In addition, the metal plate may be used to carry a contact pin or contact bolt that serves to effect the connection to mass of the control circuit. That pin or bolt may be fixed to the metal plate by soldering, welding, riveting or by a press fit, and is capable of taking up considerable forces. In contrast, the positive pole of the control circuit is preferably fixed on the circuit board and may likewise consist of a stable pin or bolt, the circuit board having gained in load-carrying capacity and stability by its connection with the metallic sheet.

The most favorable and, in terms of production, cheapest solution is achieved if the heat-dissipating means and the heat sinks are given identical or conforming configurations, especially in the form of sheet-metal bars with cut-out reeds arranged in pairs or in ring form one opposite the other and permitting the bars to be pushed onto the heating rods in force-locking clamping relationship. The heat-dissipating means and heat sinks arranged on the heating rods serve a double function, carrying off both the heat transmitted by the heating elements and the heat transmitted by the power semiconductors. In order to optimize dissipation of the heat transmitted by the power semiconductors it is preferred that the heating rods do not have any heating elements in a section immediately adjacent the housing of the control circuit, but are provided in this section with heat sinks that take up the heat loss from the power semiconductors.

In order to minimize the path of the heat loss between the power semiconductors and the heat sinks, it is preferred that the connectors project from an area of the metal plate close to the power semiconductors.

The invention will be further described hereafter with reference to the attached schematic drawings. Identical parts, or parts corresponding to each other, are indicated in the different figures by the same reference numerals.

In the drawings:

DESCRIPTION OF THE DRAWING FIGURES

FIG. 4a shows a detail of the circuit board and the metal plate; and

FIG. 4b shows an alternative embodiment of the detail of the circuit board illustrated in FIG. 4a.

DETAILED DESCRIPTION OF THE PREFERRED EMBODIMENTS

Figure 1:
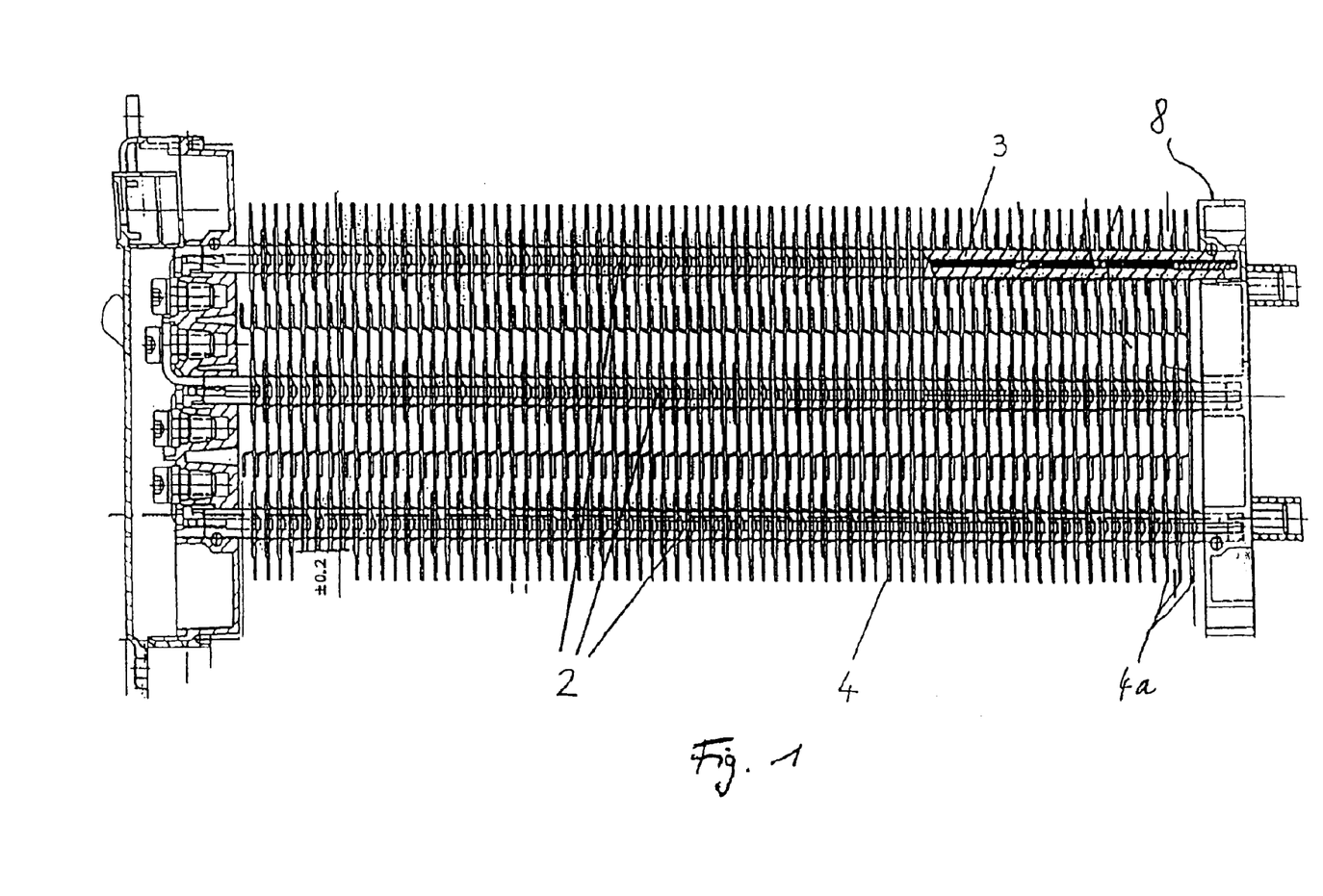
FIG. 1 shows heating elements, together with heating rods and heat-transmission means, of an electric heating system of a motor vehicle.
Figure 2:
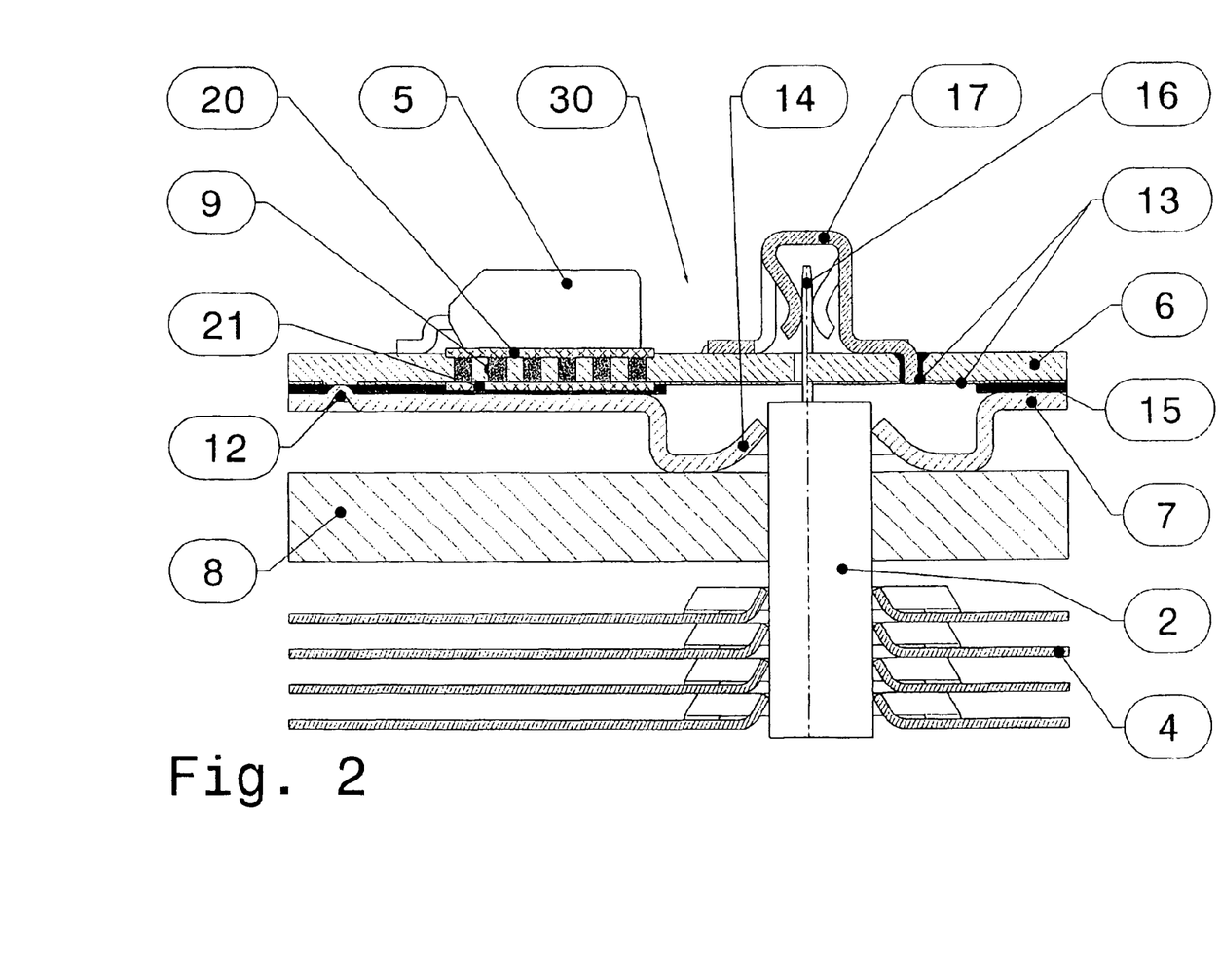
FIG. 2 shows a detail of a cross-section of an electric heating system of a motor vehicle.

FIG. 1 shows the heating rods 2, filled with PTC heating elements 3, as well as the relevant heat-dissipating means 4, which take the form of sheet-metal bars that have been pushed onto the heating rods 2 in clamping relationship, for one practical embodiment of an electric heating system for a motor vehicle. In operation of the electric heating system, an air current to be heated flows around the heating rods 2 and the respective heat-dissipating means 4, whereby heat is transmitted to the air current. It is an advantage in this connection that during that process there is transmitted to the air current not only the heat generated by the PTC heating elements 3, but also the heat generated by the components of a control circuit 30 provided in the housing 8. This not only prevents overheating of the control circuit provided in the housing 8, but also improves the efficiency of the electric heating system. The heat-dissipating means 4a serve to carry off the heat generated by the components of the control circuit 30 provided in the housing 8, of which a detail is shown in FIG. 2. The heating rods 2 do not comprise any heating elements 3 in the area of the heat-dissipating means 4a. It is thus possible for the heat generated by the control circuit 30 provided in the housing 8 to be efficiently carried off via the heat-dissipating means 4a.

In FIG. 2, a detail of a cross-section through the housing 8 shows by way of example how the heating rods 2 are connected with the control circuit 30 under mechanical and heat-conducting aspects. The control circuit 30 arranged in the housing 8 comprises for each heating rod 2 an associated power semiconductor 5 arranged on a circuit board 6. The control circuit 30 controls the power released in the heating rods 2 by means of the power semiconductors 5. The current flowing through the power semiconductors 5 has the effect to heat up those conductors as well. The following explanation shows how the power semiconductors 5 are electrically connected with the heating rods 2 and how the heat generated by the power semiconductors 5 is efficiently carried off. The bottom surface of the circuit board 6 is connected with the metal plate 7 by a solid-matter connection, i.e. a glue layer 15. The metal plate 7 is intended to be connected to mass potential, and is conductively connected to the heating rods 2. It is electrically insulated by the adhesive layer 15 from the conductor paths, which are provided on the bottom surface of the circuit board 6 and are intended to carry a potential over mass potential. The control circuit 30, together with the circuit board 6 and the metal plate 7, are accommodated in the housing 8 so that the control circuit 30 is protected from humidity. The heat generated by the power semiconductors 5 is carried off through the circuit board 6 to the metal plate 7 and from there, by the heating rod 2 serving as heat-conducting connector, from the housing 8, and is finally dissipated by the heat-dissipating means 4a. Although it is not absolutely necessary that the heating rod 2 be configured as a heat-conducting connector between the metal plate 7 and the heat-dissipating means 4a, this configuration has the advantage to provide a compact heating system. But of course there is also the possibility to provide a separate heat-conducting connector between the metal plate 7 and the heat-dissipating means 4a or the heating rod 2.

In order to assist the dissipation of the heat generated by the power semiconductors 5 through the circuit board 6, those areas of the circuit board 6 in which the power semiconductors 5 are arranged have a high density of electric current paths 9, which carry heat in addition to the electric current and which lead from the upper surface of the circuit board 6 through the latter and to its underside. These current paths 9 consist of bores filled with tin-lead solder. Dissipation of the heat from the underside of the circuit board 6 to the metal plate 7 is effected through a layer 15 of a heat-conductive adhesive, which is made as thin as possible and which preferably consists of a cross-linked two-component silicon elastomer having a thermal conductivity of more than 0.9 W/(m×K). In order to facilitate the process of bonding the metal plate 7 to the circuit board 6, the metal plate 7 is provided with a plurality of spacers 12 in the form of small bumps formed on the metal plate 7 by embossing, as can be seen especially in FIG. 4a. The glue is applied between the spacers 12, and during assembly of the metal sheet 7 and the circuit board 6 it will escape to the side so that a pore-free adhesive layer 15 of high thermal conductivity will be formed. Another function of part of those spacers 12 is to provide an electric ground connection between the metal plate 7 and a conductor path 13 of the circuit board 6, which should be connected to mass potential. Those spacers 12, that do not serve the purpose to establish an electric ground connection between the conductor path 13 and the circuit board 6, are arranged in areas of the metal plate 7 where no conductor path 13 is present on the underside of the circuit board 6 opposite to the metal plate 7.

The metal plate 7, provided on the underside of the circuit board 6, preferably has substantially the same size and the same contour as the circuit board 6. One thereby obtains a compact and mechanically stable assembly which is easy to handle during connection with the heating rods 2. The metal plate 7—and, thus, the control circuit 30 via the circuit board 6 connected with it by a solid-matter connection—is detachably connected, via a plug-in connector, with the heating rod 2 that serves as connector. Thus, advantageously, in case of a defect of the control circuit 30, the latter can be easily exchanged together with all associated parts located in the housing 8. For this purpose, tongues 14 arranged in pairs one opposite the other have been cut out from the metal plate 7 and have been bent off from the plane of the metal plate 7, as is likewise shown in FIG. 3. The mutual distance between the reeds 14 is smaller than the thickness of the rigid heating rod 2, which serves as connector and which can be introduced between a pair of tongues 14. An especially favorable close contact between the metal plate 7 and the circuit board 6 is allowed by the embodiment illustrated in FIG. 3. FIG. 2 shows another embodiment where the tongues 14 have their ends facing the heating rod 2 bent toward the metal plate 7, which facilitates the operation of mounting the heating rods 2, which act as connectors, in clamping relationship.

Figure 3:
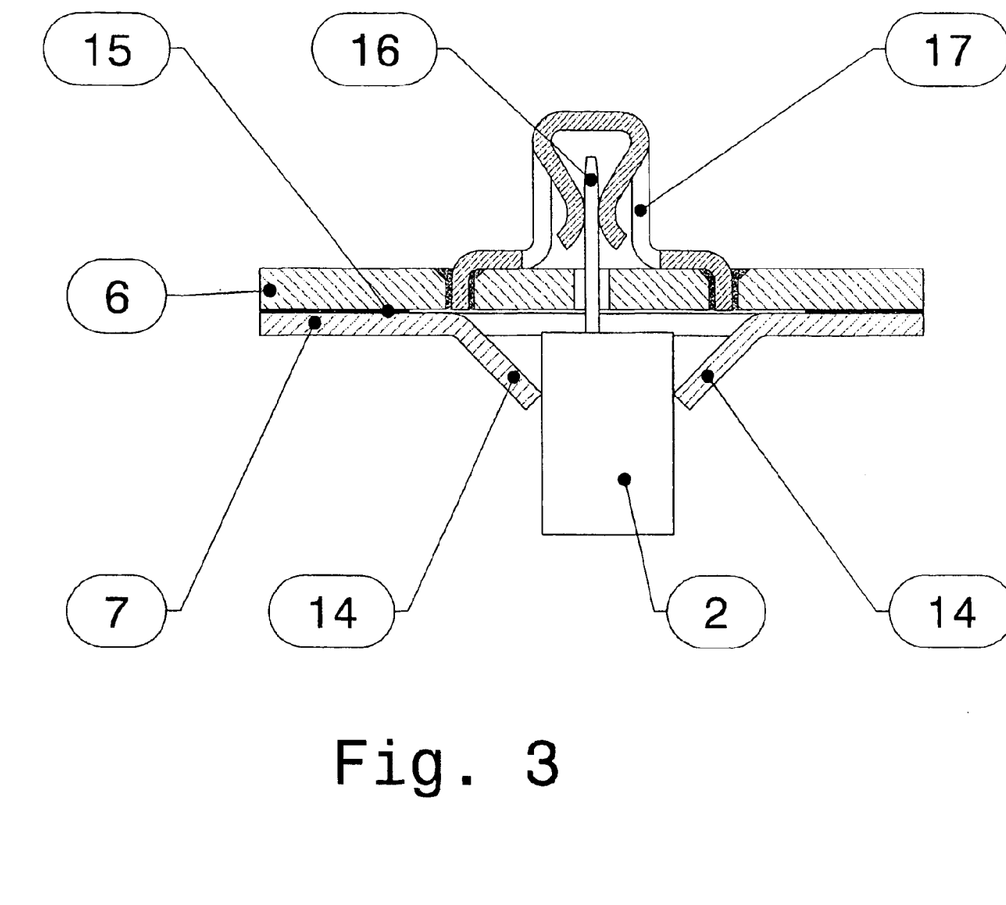
FIG. 3 shows the connection of the heating rods to the control circuit.

FIG. 3 shows, in addition to the mechanical connection between the connector 2 and the metal plate 7, the electric connection to the circuit board 6. The heating rod 2, configured as connector, is electrically connected with the metal plate 7 via its clamping contact with the reeds 14 and is, thus, likewise connected to ground potential, just as that metal plate 7.

The life conductor paths 13 of the circuit board 6 are connected with the voltage supply line 16 of the heating elements 3 inside the heating rods 2 via a connector 17 mounted on the circuit board 6.

Figure 4:
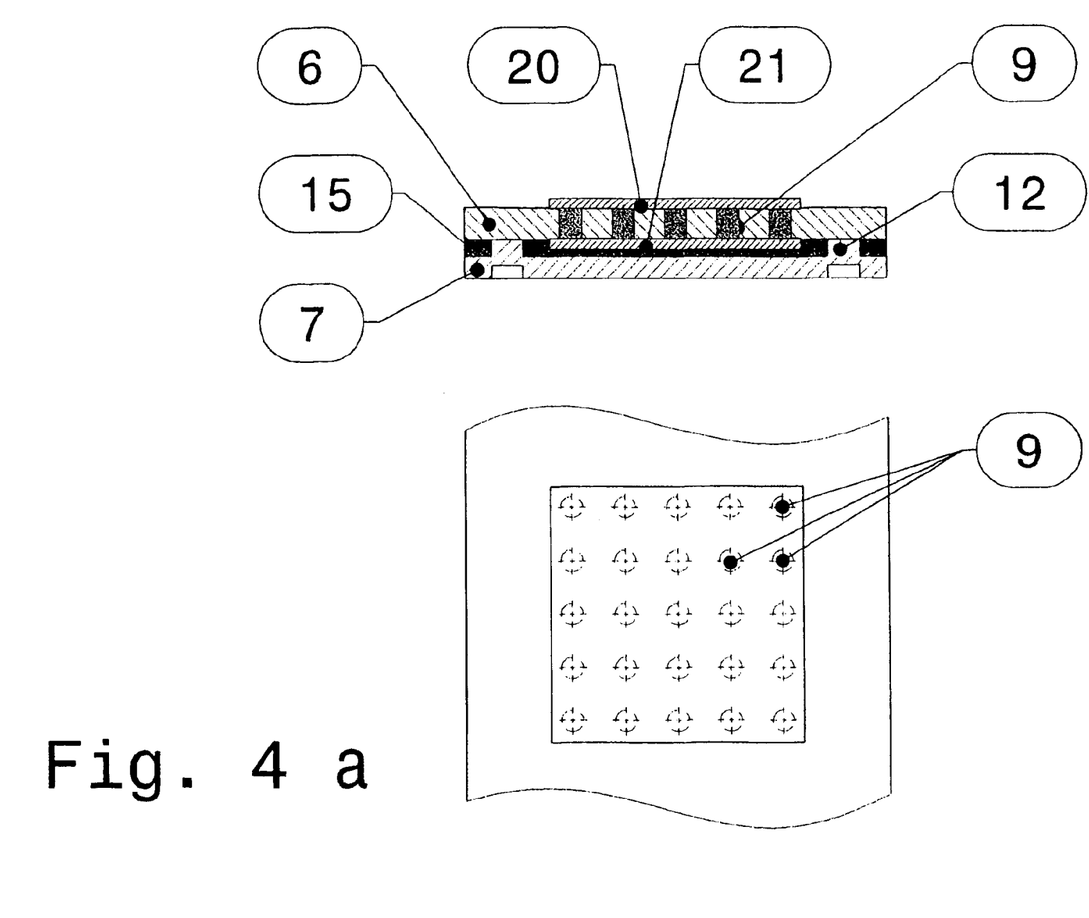

FIG. 4a shows in detail the current paths 9, that pass the circuit board 6 in the form of bores filled with tin-lead solder, as well as the opposite section of the metal plate 7 on which the bump-shaped spacers 12 are formed by embossing. The area of the circuit board 6 provided with the current paths 9 serves for mounting a power semiconductor 5 and advantageously exhibits higher thermal conductivity due to the bores filled with tin-lead solder. In order to further improve the heat dissipation, the circuit board 6 is provided, in the area of the current paths 9, with a metal surface 20 on its upper surface and a metal surface 21 on its underside, which metal surfaces 20, 21 are connected by the current paths 9 and have a size substantially equal to the basis of the respective power semiconductor 5 mounted on the metal surface 20. In the extreme, the bores may of course also be made so big that they correspond to the basis of the respective power semiconductor 5.

FIG. 4b shows an alternative embodiment of the detail of the circuit board 6 illustrated in FIG. 4a, in the area of the current paths 9. Contrary to the embodiment illustrated in FIG. 4a, the embodiment of FIG. 4b has the metal surfaces 20 and 21 on the upper surface and on the underside of the circuit board 6, respectively, countersunk into the circuit board 6. This feature has the result to reduce the length of the current paths 9 and to improve the dissipation of the heat produced by the power semiconductor 5 (see FIG. 2) to be arranged on the metal surface 20.

The embodiment illustrated in FIG. 4b differs from that shown in FIG. 4a further in that it does without the spacers 12 provided on the metal plate 7 by embossing, as illustrated in FIG. 4a. A well-defined spacing between the metal plate 7 and the circuit board 6 is guaranteed in the embodiment illustrated in FIG. 4b by particles, for example glass or ceramic particles, of defined diameter that are added to the adhesive. Such particles, which preferably have a spherical shape, are added to the glue from which the adhesive layer 15 is formed and guarantee that a defined distance equal to the diameter of the particles is maintained when the metal plate 7 is glued to the circuit board 6. An electric ground connection between the metal plate 7 and the conductor paths 13 of the circuit board 6, which should be connected to ground potential, can be achieved in this case for example through the contact of a conductor path 13 with the plug-in connector 17 illustrated in FIG. 3.

What is claimed is:

1. An electric heating system for motor vehicles comprising:
   at least one electric heating element;
   a control circuit to control the power dissipated by the at least one electric heating element;
   the control circuit including at least one power semiconductor arranged on a circuit board;
   wherein an underside of the circuit board, opposite the side that the at least one power semiconductor is arranged on, is connected to an electrically grounded metal plate by a solid matter connection;
   wherein the metal plate is electrically insulated from conductor paths located on the underside of the circuit board and carrying a voltage in relation to the grounded electric potential;
   wherein the control circuit is arranged in a housing;
   wherein at least one heat sink is provided outside the housing; and
   wherein the metal plate is connected by thermally conductive connectors to the at least one heat sink.

2. The heating system as defined in claim 1, wherein the material of the metal plate is selected from the group consisting of aluminum, copper, aluminum alloys and copper alloys.

3. The heating system as defined in claim 1 wherein a surface of the metal plate facing the circuit board carries a thin, electrically insulating layer.

4. The heating system as defined in claim 3 wherein said electrically insulating layer is a synthetic resin varnish.

5. The heating system as defined in claim 3 wherein said electrically insulating layer is on oxide layer.

6. The heating system as defined in claim 3 wherein said electrically insulating layer is anodically reinforced.

7. The heating system as defined in claim 1, wherein a glue layer is provided to attach the metal plate to the circuit board.

8. The heating system as defined in claim 7, wherein the glue layer is provided between the metal plate and the circuit board and has a thermal conductivity of at least 0.8 W/(m×K).

9. The heating system as defined in claim 7, wherein the glue layer is provided between the metal plate and the circuit board and has a conductivity of at least 0.9 W/(m×K).

10. The heating system as defined in claim 7, wherein the glue layer is a cross-linked two-component silicon elastomer.

11. The heating system as defined in claim 7, wherein the thickness of the glue layer is less than 0.2 mm.

12. The heating system as defined in claim 7, wherein the thickness of the glue layer is less than 0.15 mm.

13. The heating system as defined in claim 1, wherein the metal plate is approximately as big as the circuit board.

14. The heating system as defined in claim 1, wherein the metal plate has approximately the same contour as the circuit board.

15. The heating system as defined in claim 1, wherein at least one rigid spacer is provided between the metal plate and the circuit board, to provide a small gap between the metal plate and the circuit board.

16. The heating system as defined in claim 15, wherein the at least one spacer takes the form of bumps provided on the metal plate in areas opposite to the underside of the circuit board where no conductor paths are arranged.

17. The heating system as defined in claim 15, wherein the at least one spacer is formed by embossing of the metal plate.

18. The heating system as defined in any of claim 15, wherein the metal plate is connected with a conductor path of the circuit board, which is connected to the grounded potential, by at least one spacer.

19. The heating system as defined in claim 1, wherein the circuit board has a high density of electrical current paths in those areas where the power semiconductors are provided, and the current paths lead from the upper surface of the circuit board, through the circuit board, to the underside of the circuit board.

20. The heating system as defined in claim 19, wherein the current paths are inside bores filled with metal.

21. The heating system as defined in claim 20, wherein the metal filled in the inside bores is selected from the group consisting of copper and tin-lead solder.

22. The heating system as defined in claim 19, wherein the current paths connect a metal surface on an upper surface of the circuit board with a metal surface on the underside of the circuit board.

23. The heating system as defined in claim 22, wherein the metal surfaces are approximately the size of a base surface of a respective power semiconductor.

24. The heating system as defined in claim 1, wherein the connectors are detachably connected with at least one of the metal plate and at least one heat sink.

25. The heating system as defined in claim 24, wherein the connection between the connectors and at least one of the metal plate and at least one heat sink is a plug-in connection.

26. The heating system as defined in claim 25, wherein tongues arranged in pairs one opposite the other, are cut out from the metal plate and are bent off from the plane of the metal plate, the distance between such tongues being smaller than the thickness of the rigid connector that can be introduced between any pair of tongues.

27. The heating system as defined in claim 24, wherein the connectors have a rigid configuration.

28. The heating system as defined in claim 24, wherein the connectors are configured as a rod.

29. The heating system as defined in claim 24, wherein the connectors are configured as a hollow rod.

30. The heating system as defined in claim 1, wherein the at least one heat sink is a metal sheet.

31. The heating system as defined in claim 1, wherein the at least one heat sink connects the connectors one to the other.

32. The heating system as defined in claim 31, wherein the at least one the heat sink is pushed onto the connectors.

33. The heating system as defined in claim 32, wherein the at least one heat sink is held on the connectors in force-locking engagement.

34. The heating system as defined in claim 1, wherein the at least one electric heating element dissipates the heat generated via a heat-dissipating means which, when mounted in a vehicle in the intended way, lie in a channel that can be passed by air for the purpose of heating up the passenger compartment of the vehicle.

35. The heating system as defined in claim 34, wherein the at least one heat sink is positioned proximate to the heat-dissipating means of the at least one electric heating element.

36. The heating system as defined in claim 35, wherein the at least one heat sink is arranged between the heat-dissipating means and the housing, though at a distance from the housing.

37. The heating system as defined in claim 34, wherein the heat-dissipating means and the at least one heat sink are designed identically or in a conforming fashion.

38. The heating system as defined in claim 1, wherein the at least one electric heating element is contained in heating rods which simultaneously serve as connectors between the metal plate and the at least one heat sink.

39. The heating system as defined in claim 38, wherein the heating rods do not have any heating elements on a section following the housing, where the at least one heat sink is provided.

40. The heating system as defined in claim 1, wherein the connectors extend from an area which is close to the at least one power semiconductor.

41. The heating system as defined in claim 1, wherein at least one potential-carrying supply line to the at least one electric heating element is connected to a power output of a respective power semiconductor by a plug-in-connector provided on the circuit board.

42. The heating system as defined in claim 41, wherein the at least one supply line is rigidly connected with the at least one electric heating element and the plug-in direction of the plug-in connector coincides with the longitudinal direction of the at least one electric heating element.

43. The heating system as defined in claim 41, wherein the plug-in connector is arranged on a surface of the circuit board that faces away from the metal plate, and is accessible for the supply line through a hole in the circuit board.

* * * * *